United States Patent
Ajima et al.

(10) Patent No.: US 11,074,947 B2
(45) Date of Patent: Jul. 27, 2021

(54) SEMICONDUCTOR MEMORY APPARATUS AND DATA PROCESSING SYSTEM

(71) Applicant: FUJITSU LIMITED, Kawasaki (JP)

(72) Inventors: Yuichiro Ajima, Kawasaki (JP); Toshiyuki Shimizu, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/837,564

(22) Filed: Apr. 1, 2020

(65) Prior Publication Data

US 2020/0335143 A1  Oct. 22, 2020

(30) Foreign Application Priority Data

Apr. 17, 2019  (JP) .............................. JP2019-078778

(51) Int. Cl.
| | |
|---|---|
| *G11C 5/04* | (2006.01) |
| *G11C 5/06* | (2006.01) |
| *G11C 7/10* | (2006.01) |
| *G11C 29/44* | (2006.01) |

(52) U.S. Cl.
CPC .............. *G11C 7/1051* (2013.01); *G11C 5/04* (2013.01); *G11C 5/06* (2013.01); *G11C 7/1006* (2013.01); *G11C 7/1015* (2013.01); *G11C 29/44* (2013.01)

(58) Field of Classification Search
CPC ... G11C 7/1006; G11C 7/1015; G11C 7/1051; G11C 5/04; G11C 5/06; G11C 29/44
USPC .......................... 365/51, 63, 189.011, 189.2
See application file for complete search history.

(56) References Cited

U.S. PATENT DOCUMENTS

| | | | | |
|---|---|---|---|---|
| 8,773,939 | B2* | 7/2014 | Oh ........................... | G11C 8/12 |
| | | | | 365/230.03 |
| 8,873,267 | B2* | 10/2014 | Lee ..................... | H01L 25/0655 |
| | | | | 365/63 |
| 9,324,380 | B2* | 4/2016 | Byeon ................ | G11C 29/1201 |
| 9,851,401 | B2* | 12/2017 | Kim ................. | G01R 31/31813 |
| 10,096,577 | B2* | 10/2018 | Kim .................... | G11C 29/1201 |
| 10,224,080 | B2* | 3/2019 | Funaki ................. | G11C 29/025 |
| 10,283,178 | B2* | 5/2019 | Takahashi ................ | G11C 8/12 |

(Continued)

FOREIGN PATENT DOCUMENTS

| | | |
|---|---|---|
| JP | 2011-166147 A | 8/2011 |
| JP | 2013-65393 A | 4/2013 |
| JP | 2017-10605 A | 1/2017 |

OTHER PUBLICATIONS

KROA—Korean Office Action dated Feb. 4, 2021 for corresponding Korean Patent Application No. 10-2020-0044643 with English Translation.

*Primary Examiner* — Son L Mai
(74) *Attorney, Agent, or Firm* — Fujitsu Patent Center

(57) ABSTRACT

A semiconductor memory apparatus includes a plurality of memory dies and a logic die, which are stacked to each other. The logic die includes a memory interface for a memory apparatus to be coupled to the semiconductor memory apparatus, and a switch coupled to a plurality of channels included in a control device which controls the semiconductor memory apparatus. The switch includes a first switch element which couples one of the plurality of channels to the memory interface or one of the plurality of memory dies, and a second switch element which couples another one of the plurality of channels to another one of the plurality of memory dies. Even if some memory dies are defective, the semiconductor memory apparatus is capable to operate.

9 Claims, 14 Drawing Sheets

(56) References Cited

U.S. PATENT DOCUMENTS

| | | |
|---|---|---|
| 10,365,325 B2 * | 7/2019 | Dono .................. G11C 29/022 |
| 2009/0161401 A1 | 6/2009 | Bilger et al. |
| 2013/0070507 A1 | 3/2013 | Yoon |
| 2013/0292840 A1 | 11/2013 | Shoemaker et al. |
| 2014/0346516 A1 | 11/2014 | Lee et al. |
| 2015/0113356 A1 | 4/2015 | Ken et al. |

* cited by examiner

FIG. 2

| MEM1 | MEM2 | SWITCH UNIT 10 | SHIPPING TYPE |
|---|---|---|---|
| ○ | ○ | MEM1 —○ ○— CH1, MEM2 —○ ○— CH2 | STACKED MEMORY (HIGH-SPEED MEMORY MODE) |
| ○ | × | MEMORY MODULE INTERFACE 30 } MEM1 —○ ○— CH1, —○ ○— CH2 | COMBINED PRODUCT (MIXED MEMORY MODE) |
| × | ○ | MEMORY MODULE INTERFACE 30 } MEM2 —○ ○— CH1, —○ ○— CH2 | COMBINED PRODUCT (MIXED MEMORY MODE) |
| × | × | MEMORY MODULE INTERFACE 30 } —○ ○— CH1, —○ ○— CH2 | MEMORY MODULE INTERFACE COMPONENT (MEMORY MODULE MODE) |

SEMICONDUCTOR MEMORY APPARATUS AND DATA PROCESSING SYSTEM

CROSS-REFERENCE TO RELATED APPLICATION

This application is based upon and claims the benefit of priority of the prior Japanese Patent Application No. 2019-78778, filed on Apr. 17, 2019, the entire contents of which are incorporated herein by reference.

FIELD

The embodiments discussed herein are related to a semiconductor memory apparatus and a data processing system.

BACKGROUND

Recently, as data processing systems become more highly functionalized, there is a tendency that an operating frequency and a bandwidth of a semiconductor memory apparatus mounted over the system are increased, and there is proposed a method of mounting a plurality of dies in high integration by using a packaging technology such as three-dimensional mounting or 2.5-dimensional implementation. In this type of method, for example, a stacked memory die is coupled to a system on a chip (SoC) via an interface such as a silicon Interposer (see, for example, Japanese Laid-open Patent Publication No. 2017-10605).

A plurality of stacked memory dies are mounted over a printed circuit substrate together with an input and output circuit die for inputting and outputting data between the plurality of memory dies and an outside (see, for example, Japanese Laid-open Patent Publication No. 2013-65393). For example, the plurality of memory dies are stacked by being coupled to each other via a through silicon via (TSV) provided through the die.

There is proposed a semiconductor memory apparatus in which a channel is configured corresponding to each of a plurality of memory cell arrays provided in a semiconductor die, and different input and output interfaces may be set for the respective channels (see, for example, Japanese Laid-open Patent Publication No. 2011-166147).

In a case where a plurality of memory dies are stacked to produce a stacked memory, a large number of through-electrodes of a memory die are required to be accurately coupled to a large number of through-electrodes of another memory die. For example, in a case where a coupling failure occurs in the through-electrode in a stacked memory. In which a dedicated through-electrode is provided for each memory die, an operation failure occurs in the memory die using the through-electrode in which the coupling failure occurs, but the other memory die operates normally. Meanwhile, in a case where the operation occurs in one memory die, the entire produced stacked memory is treated as a defective product and is discarded.

In one aspect of the present embodiment, in a semiconductor memory apparatus in which a plurality of memory dies are stacked (hereinafter, simply referred to as a semiconductor apparatus), even in a case where some of the memory dies do not operate normally, it is possible to make the semiconductor apparatus usable without setting the semiconductor memory apparatus as a defective product.

SUMMARY

According to an aspect of the embodiments, a semiconductor memory apparatus includes a plurality of memory dies and a logic die that are stacked to each other. The logic die includes a memory interface for a memory apparatus to be coupled to the semiconductor memory apparatus, and a switch coupled to a plurality of channels included in a control device which controls the semiconductor memory apparatus. The switch includes a first switch element which couples one of the plurality of channels to the memory interface or one of the plurality of memory dies, and a second switch element which couples another one of the plurality of channels to another one of the plurality of memory dies.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. is a diagram illustrating an example of a semiconductor apparatus according to an embodiment;

FIG. 2 is an explanatory diagram illustrating an example of a result of a final test in an assembling process for a stacked memory in FIG. 1 and a shipping type of the stacked memory;

In FIG. 3;

DESCRIPTION OF EMBODIMENTS

Figure 1:
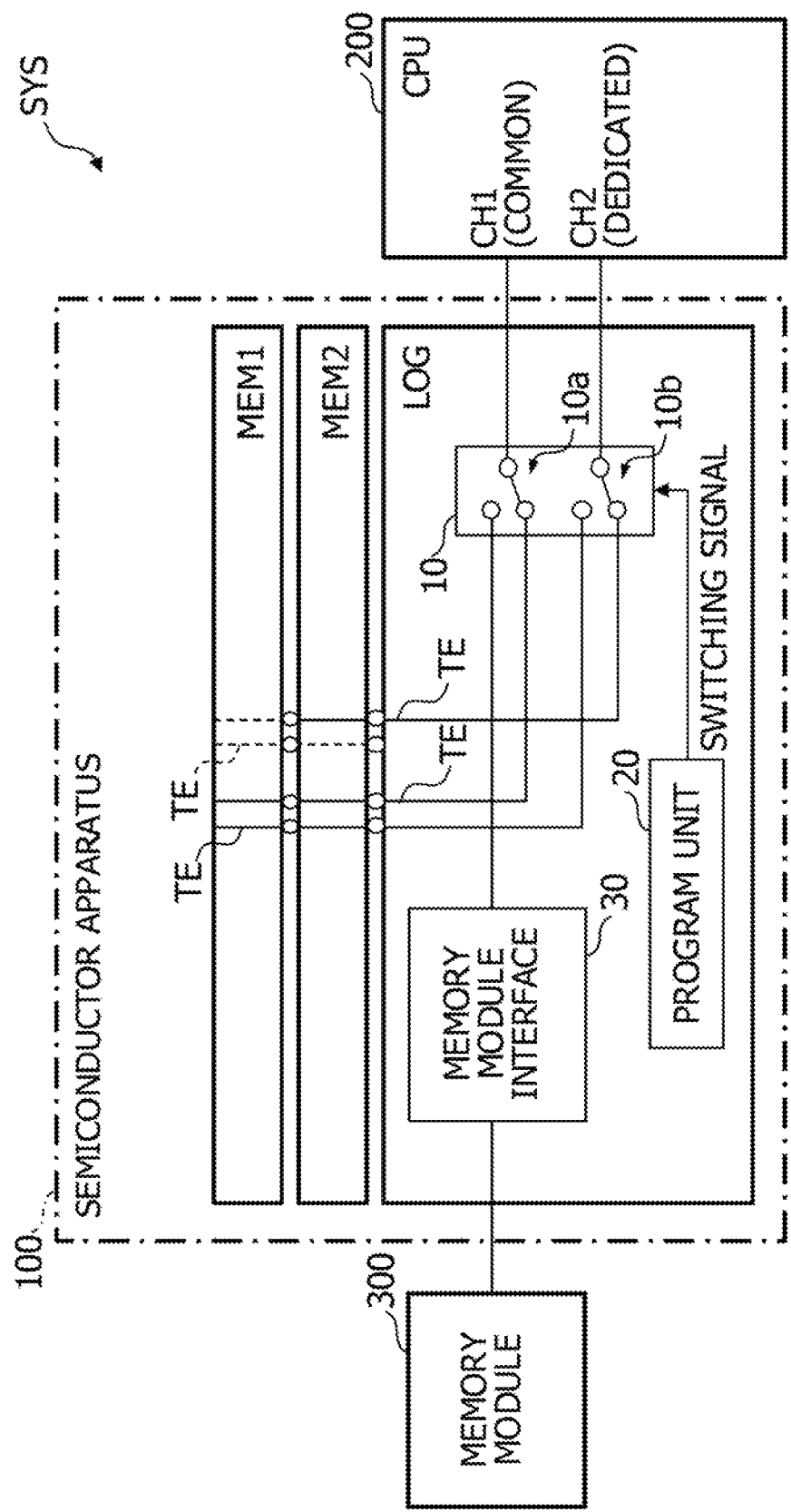

Hereinafter, embodiments will be described with reference to the drawings. In each of the drawings, a line indicating a signal line collectively represents a plurality of signal lines, in some cases.

For example, in a semiconductor integrated circuit in which a semiconductor circuit is formed over a silicon substrate by using a fine element or a wiring, a logic integrated circuit and a memory integrated circuit are manufactured by using different semiconductor manufacturing technologies. For example, the logic integrated circuit and the memory integrated circuit are manufactured as separate chips, and the logic integrated circuit chip and the memory integrated circuit chip are used as a system or the like by being coupled by an electrical signal. As an integration degree of logic integrated circuits and memory integrated circuits is improved, coupling between the logic integrated circuit and the memory integrated circuit requires wide-bandwidths more.

For example, a semiconductor chip (die) is mounted over a fine wiring substrate to be packaged as an integrated circuit (IC) package, and the IC package is mounted over a printed substrate to manufacture an electronic apparatus. Since there is a limit to the number of terminals coupling the IC package to the printed substrate, in order to expand a coupling bandwidth between the logic integrated circuit and the memory integrated circuit, it is preferable to increase the number of memory packages including the memory integrated circuit and to increase a speed of the signal. Meanwhile, for example, in a case where a large number of memory packages are mounted in the memory package and a high-speed signal is transmitted between the memory package and the logic integrated circuit, there is a problem that power consumption increases.

For example, a plurality of memory integrated circuit chips are stacked, mounted over a single IC package, and a coupling distance between chips is shortened to reduce a wiring load, so that. It is possible to reduce the power consumption. By mounting a plurality of stacked memory integrated circuit chips over a logic integrated circuit chip, it is possible to minimize the coupling distance between the logic integrated circuit chip and the memory integrated circuit chip. Meanwhile, when heat generated in the logic integrated circuit chip having larger power consumption than the memory integrated circuit chip is transferred to the memory integrated circuit chip, there is a possibility that a cooling performance of the memory integrated circuit chip may be caused. In the following, the plurality of stacked memory integrated circuit chips are also referred to as a three-dimensional stacked memory or a stacked memory.

As a method for solving the problem of cooling, there is a so-called 2.5-dimensional implementation in which a logic integrated circuit chip having large power consumption is disposed adjacent to a three-dimensional stacked memory in an IC package. In a three-dimensional stacked memory of 2.5-dimensional implementation, as a chip for interfacing with a logic integrated circuit chip, which is disposed immediately below a memory integrated circuit chip, only an input and output interface having low power consumption and a small-scale logic circuit are mounted, so that power consumption is reduced.

In the following, the chip for interface is referred to as a logic die. In order to couple a logic integrated circuit chip and a logic die with higher density and lower power consumption than wiring of the IC package, a silicon interposer technology may be used in which a logic integrated circuit and a three-dimensional stacked memory are mounted over a silicon substrate over which only a wiring is formed. For example, the number of signal lines coupling the logic die and the logic integrated circuit chip is greater than 1000.

Since the number of signal lines is large, the signal lines may be divided into a plurality of logically independent groups called channels. The channel may be disposed on a side adjacent to the logic integrated circuit of the logic die, and the logic die and the three-dimensional stacked memory may be electrically coupled by a through via provided in a central portion of the logic die.

In such a three-dimensional stacked memory technology, each channel couples a specific chip and a specific area among the stacked memory integrated circuit chip one-to-one by a dedicated through via, in some cases. For example, in a memory chip mounted over an IC package and a memory chip used in a three-dimensional stacked memory, a technology for forming a memory circuit over a semiconductor substrate, such as a silicon substrate, is common. In a memory module and the three-dimensional stacked memory, in many cases, a reference particle size of data is 64 bytes, for example, in accordance with a specification of the logic integrated circuit side which makes accesses to these memories. Therefore, the memory chip mounted in the IC package and the three-dimensional stacked memory and the memory module have many common points, but it is not easy to mutually convert or mix signal interfaces.

For example, in the memory module, a high-speed signal transmission technology using a double data rate (DDR) method in which data is transmitted at a frequency 2 times a transmission frequency of an address is used, and in the three-dimensional stacked memory, transmission frequencies of an address and data are the same. Timings from a time when the logic integrated circuit outputs an address to a time when data is transferred are different in respective cases where the data is read and written. Each memory chip has a plurality of banks accessed through a common input and output circuit. Therefore, it is required to manage the output timings of the read and write addresses for each bank, and to perform control so that outputs of the address or the data between the banks do not collide with each other.

Although in the three-dimensional stacked memory of 2.5-dimensional implementation, a through via is drilled in the logic die and the memory chip to electrically couple the upper and lower dies, this type of three-dimensional stacking technology has a problem that manufacturing failures are likely to occur.

FIG. 1 is a diagram illustrating an example of a semiconductor apparatus according to an embodiment. A semiconductor apparatus 100 illustrated in FIG. 1 includes a plurality of stacked memory dies MEM (MEM1 and MEM2) and a logic die LOG. The memory die MEM and the logic die LOG are electrically and mechanically coupled to each other, for example, by coupling through-electrodes TE formed in each die to each other via bumps indicated by circles in FIG. 1. In the following, the semiconductor apparatus 100 is also referred to as a stacked memory 100.

The plurality of stacked memory dies MEM have the same types to one another, for example, and have the through-electrodes TE at the same positions over a layout as seen in a plan view. A position of the through-electrode TE coupling the memory die MEM1 and the logic die LOG is different from a position of the through-electrode TE coupling the memory die MEM2 and the logic die LOG as seen in a plan view. In FIG. 1, the broken lines in the memory dies MEM1 and MEM2 indicate the unused through-electrodes TE.

Each memory die MEM includes, for example, a memory cell array of a dynamic random-access memory (DRAM). Meanwhile, each memory die MEM may include a memory cell array of a static random-access memory (SRAM), a flash memory, a magnetic random-access memory (MRAM), a resistive random-access memory (ReRAM), or a ferroelectric memory. The number of memory dies MEM may be 2 or more.

The logic die LOG includes a switch unit 10, a program unit 20, and a memory module interface 30. The memory module interface 30 is an example of a memory interface.

The logic die LOG includes the through-electrode TE at a position corresponding to the through-electrode TE of the memory die MEM2 in a state of being coupled to the memory die MEM2.

The switch unit 10 is coupled to an input and output interface unit (not illustrated) included in a central processing unit (CPU) 200 which reads and writes data from and to the stacked memory 100. For example, the CPU 200 has two channels CH (CH1 and CH2) for memory access. A switch 10a of the switch unit 10 couples the channel CH1 of the CPU 200 to the memory die MEM1 or the memory module interface 30. A switch 10b of the switch unit 10 couples the channel CH2 of the CPU 200 to the memory die MEM1 or the memory die MEM2. The CPU 200 is an example of a control device which controls the stacked memory 100. The switch 10a is an example of a first switch element, and the switch 10b is an example of a second switch element.

Another processor for reading and writing data from and to the stacked memory 100 or a logic chip such as a system on a chip (SoC) may be coupled to the stacked memory 100 instead of the CPU 200. The system SYS is configured by the stacked memory 100 and the CPU 200.

The program unit 20 is programmed with a switch state of the switch unit 10 based on whether or not the plurality of stacked memory dies MEM are normally operated. For example, the program of the program unit 20 is executed in a test process for the stacked memory 100. The program unit 20 outputs a switching signal for switching coupling states of the switches 10a and 10b according to the programmed state. For example, the program unit 20 includes a fuse or a non-volatile memory cell for setting a logic of the switching signal according to the program state.

The memory module interface 30 is coupled to the memory module 300 to be accessed to the CPU 200, accesses the memory module 300 based on an access command output from the CPU 200, and reads and writes data. The memory module interface 30 may have a function of converting the access command, an address, or data output from the CPU 200 according to input and output specifications of the memory module 300. The memory module interface 30 is an example of a memory apparatus.

The channel CH1 of the CPU 200 functions as a common channel for reading and writing data to and from the memory die MEM1 or the memory module 300. The channel CH2 of the CPU 200 functions as a dedicated channel for reading and writing data to and from the memory die MEM1 or the memory die MEM2.

The stacked memory 100 is manufactured by stacking the memory dies MEM1 and MEM2 which pass a test and the logic die LOG which passes the test. For example, operations of the memory dies MEM1 and MEM2 and the logic die LOG stacked in the stacked memory 100 are guaranteed. In an assembling process in which the memory dies MEM1 and MEM2 and the logic die LOG are coupled to each other by bumps, in a case where a coupling failure of the bumps occurs, the stacked memory 100 fails in a final test performed in a test process after assembling.

Meanwhile, in this embodiment, the stacked memory 100, which is confirmed to operate normally in either the memory die MEM1 or the memory die MEM2 in the final test, is shipped as a combined product with the memory module 300 by the program unit 20 being programmed. Alternatively, in a case where coupling failures are detected in both the memory die MEM1 and the memory die MEM2 in the final test, the stacked memory 100 is shipped as a memory module interface component which uses only the memory module interface 30.

FIG. 2 is an explanatory diagram illustrating an example of a result of a final test in an assembling process for the stacked memory 100 in FIG. 1 and a shipping type of the stacked memory 100. In the fields of the memory die MEM1 and the memory die MEM2 in FIG. 2, the circles indicate a pass in a final test, and the X indicates a fail in the final test. The memory module interface 30 is guaranteed to operate normally by only the logic die LOG passing in the test.

In a case where all the memory dies MEM2 and MEM1 included in the stacked memory 100 pass, the switch unit 10 is switched to couple the channel CH1 to the memory die MEM1 and to couple the channel CH2 to the memory die MEM2. The stacked memory 100 is shipped as a stacked memory (a high-speed memory mode product).

In a case where the memory die MEM1 passes and the memory die MEM2 fails, the switch unit 10 is switched to couple the channel CH1 to the memory module interface 30 and to couple the channel CH2 to the memory die MEM1. The stacked memory 100 is shipped as a combined product (a mixed memory mode product).

In a case where the memory die MEM1 fails and the memory die MEM2 passes, the switch unit 10 is switched to couple the channel CH1 to the memory module interface 30 and to couple the channel CH2 to the memory die MEM2. The stacked memory 100 is shipped as a combined product (a mixed memory mode product). In the mixed memory mode product, the CPU 200 may access both the memory die MEM and the memory module 300.

In a case where all the memory dies MEM1 and MEM2 included in the stacked memory 100 fail, the switch unit 10 is switched to couple the channel CH1 to the memory module interface 30 and to open the channel CH2. The stacked memory 100 is shipped as a memory module interface component (a memory module mode product). The channel CH2 may be coupled to one of output nodes.

As described above, in the embodiment illustrated in FIGS. 1 and 2, the switch unit 10 which couples the channel CH of the CPU 200 to either the memory die MEM or the memory module interface 30 is provided in the logic die LOG. Thus, even in a case where one or both of the memory dies MEM1 and MEM2 are not operated, the stacked memory 100 may be used as a mixed memory mode or a memory module mode, and the stacked memory 100 may be shipped without discarding. As a result, it is possible to reduce a discard rate of the stacked memory 100 and to reduce a manufacturing cost of the stacked memory 100 as compared with a case where both of the memory die MEM1 and the memory die MEM2 do not operate and may not be shipped.

Figure 3:
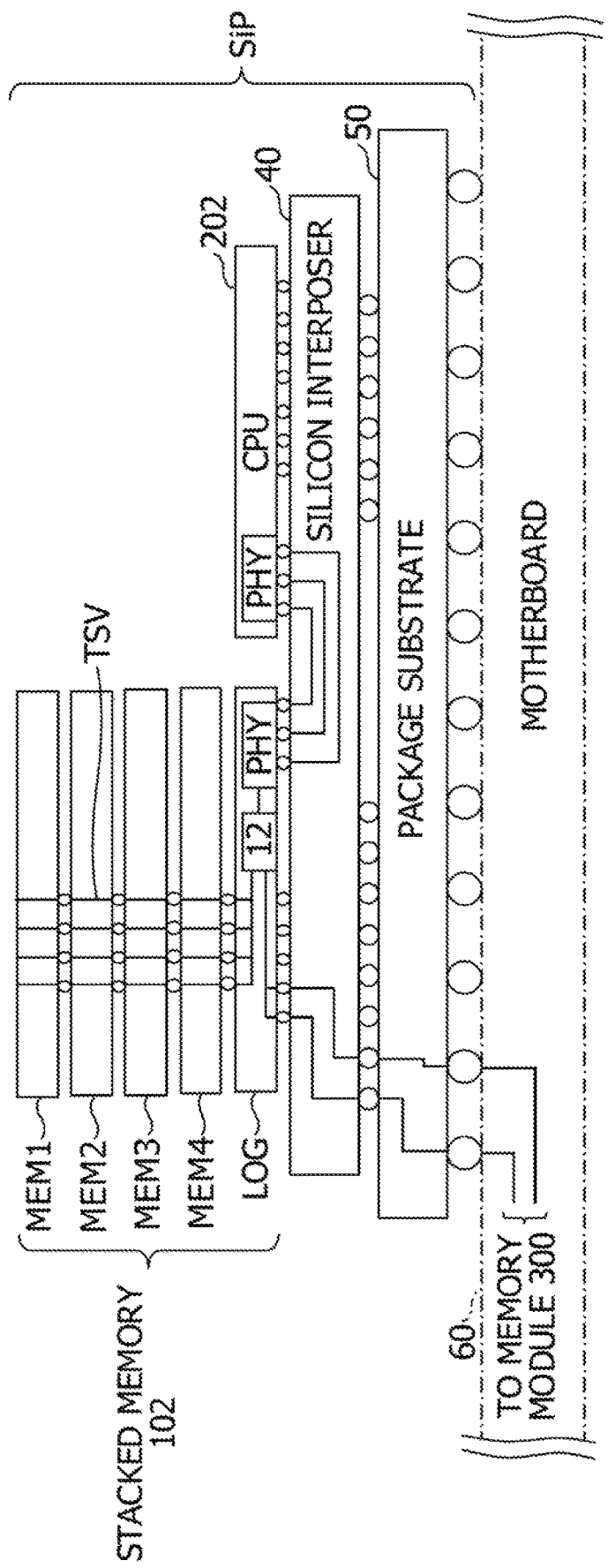
FIG. 3 is a side view illustrating an example of a system-in-package over which a semiconductor apparatus according to another embodiment is mounted.

FIG. 3 illustrates an example of a system-in-package over which a semiconductor apparatus according to another embodiment is mounted. Components which are the same as or which have the same manner as the components illustrated in FIG. 1 are indicated by the same reference numerals, and detailed descriptions thereof will be omitted.

A system-in-package SIP illustrated in FIG. 3 includes a stacked memory 102 in which a plurality of memory dies MEM (MEM1, MEM2, MEM3, and MEM4) and the logic die LOG are stacked, a CPU 202, a silicon interposer 40, and a package substrate 50. The stacked memory 102 is an example of a semiconductor apparatus. The number of stacked layers of the memory dies MEM may be two or more. The CPU 202 is an example of a control device which controls the stacked memory 102. In the following, in some cases, the stacked memory 102 and the CPU 202 are referred to as devices. The system-in-package SiP is an example of a system.

For example, each memory die MEM and logic die LOG has a through-silicon via (TSV), and the memory die MEM and the logic die LOG are coupled to each other via bumps and the TSVs. The TSV is an example of a through-electrode. FIG. 3 illustrates a state of the system-in-package SIP as seen in a side view, and the bumps are indicated by circles. The logic die LOG has an input and output interface unit PHY for inputting and outputting a signal to and from the CPU 202. The switch unit 12 of the logic die LOG will be described with reference to FIG. 4.

The CPU 202 has an input and output interface unit PHY for inputting and outputting a signal to and from the logic die LOG. The input and output interface unit PHY of the CPU 202 and the input and output interface unit PHY of the logic die LOG are coupled to each other via the silicon interposer 40. Instead of the CPU 202, another processor or another logic chip may be coupled to the stacked memory 102 via the silicon interposer 40.

The logic die LOG of the stacked memory 102 is coupled to the silicon interposer 40 via bumps, and the CPU 202 is coupled to the silicon interposer 40 via bumps. A part of an external terminal (the bump) of the logic die LOG and a part of an external terminal (the bump) of the CPU 202 are coupled to the package substrate 50 via the silicon interposer 40. In the package substrate 50, the bumps illustrated on the lower side in FIG. 3 are coupled to, for example, a motherboard 60 of an information processing apparatus (not illustrated) or the like (a server or the like). The memory module 300 illustrated in FIG. 4 is coupled to the logic die LOG via the motherboard 60, the package substrate 50, and the silicon interposer 40.

Figure 4:
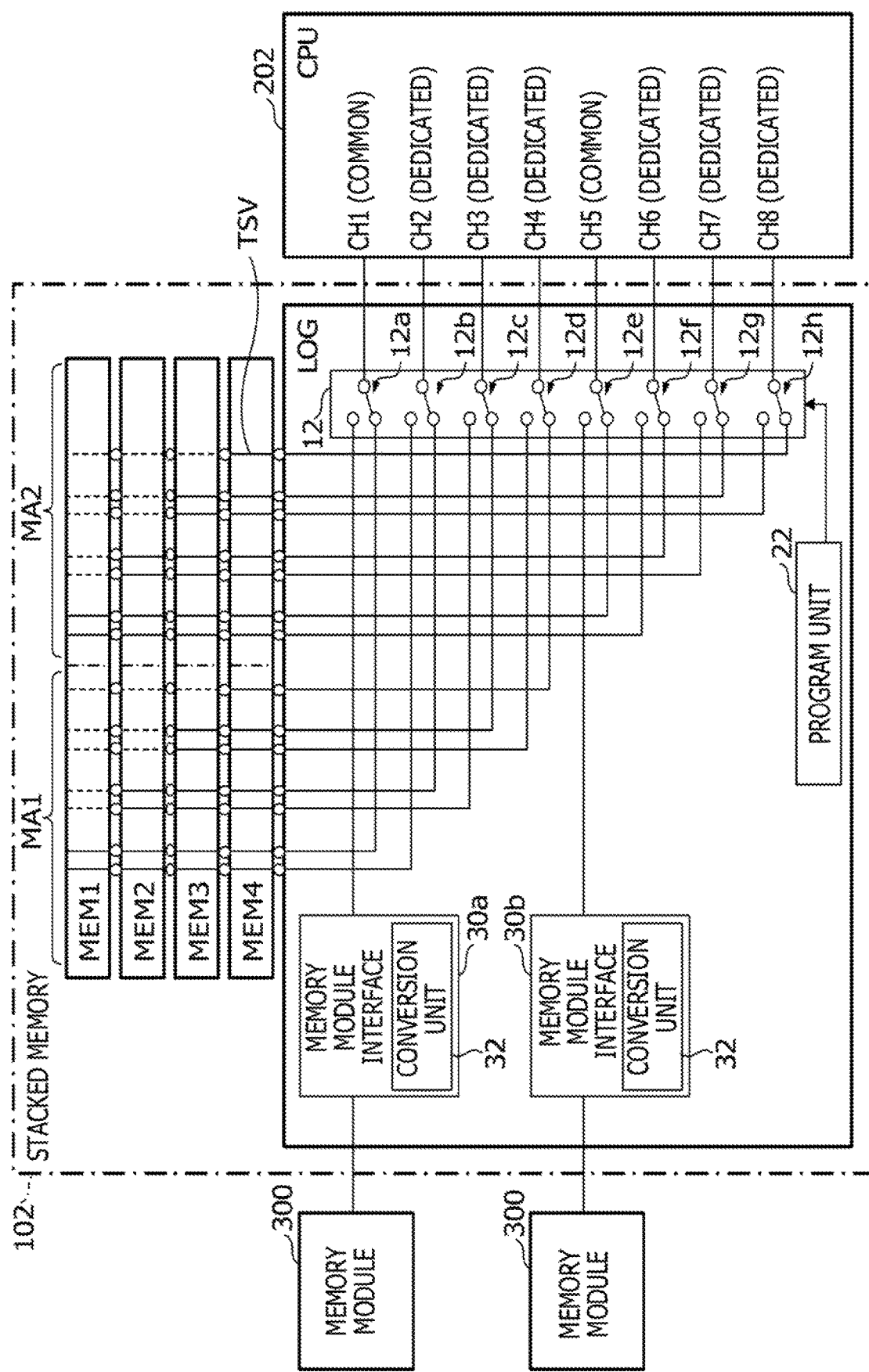
FIG. 4 is a block diagram illustrating an example of a stacked memory in FIG. 3.

FIG. 4 illustrates an example of the stacked memory 102 in FIG. 3. Components which are the same as or which have the same manner as those illustrated in FIG. 1 are indicated by the same reference numerals, and detailed descriptions thereof will be omitted. The broken lines in the memory die MEM indicate unused TSVs. In FIG. 4, description of an interface area including the input and output interface unit PHY illustrated in FIG. 3 is not illustrated. For example, in the logic die LOG, the interface area may be provided on the CPU 202 side of the switch unit 12, or may be provided in an area overlapping with the switch unit 12. Each memory die MEM has two memory areas MA (MA1 and MA2) respectively corresponding to the channels CH of the CPU 202. The memory area MA will be described with reference to FIG. 5.

In the same manner as the logic die LOG illustrated in FIG. 1, the logic die LOG of this embodiment includes the switch unit 12, a program unit 22, and the two memory module interfaces 30 (30a and 30b). The switch unit 12 includes 8 switches 12a, 12b, 12c, 12d, 12e, 12f, 12g, and 12h which are respectively coupled to the 8 channels of the CPU 202. The switches 12a and 12e are one example of a first switch, and the switches 12b, 12c, 12d, 12f, 12g, and 12h are an example of a second switch.

The switch 12a couples the channel CH to the memory area MA1 or a memory module interface 30a of the memory die MEM1. The switch 12b couples the channel CH2 to one of the memory areas MA1 of the memory dies MEM1 and MEM2. The switch 12c couples a channel CH3 to one of the memory areas MA1 of the memory dies MEM2 and MEM3. The switch 12d couples a channel CH4 to one of the memory areas MA1 of the memory dies MEM3 and MEM4.

The switch 12e couples a channel CH5 to the memory area MA2 of the memory die MEM1 or the memory module interface 30b. The switch 12f couples a channel CH6 to one of the memory areas MA2 of the memory dies MEM1 and MEM2. The switch 12g couples a channel CH7 to one of the memory areas MA2 of the memory dies MEM2 and MEM3. The switch 12h couples a channel CH8 to one of the memory areas MA2 of the memory dies MEM3 and MEM4.

The program unit 22 outputs switching signals for switching coupling states of the switches 12a to 12h. For example, in the same manner as the program unit 20 illustrated in FIG. 1, the program unit 22 includes a fuse or a non-volatile memory cell for setting a logic of the switching signal according to a program state.

In the same manner as the memory module interface 30 illustrated in FIG. 1, the memory module interfaces 30 (30a and 30b) access the memory module 300 based on an access command and an address output from the CPU 202, and read and write data.

For example, the memory module 300 includes a plurality of double data rate (DDR) synchronous dynamic random-access memories (SDRAMs), and operates by a DDR interface. For example, the memory module interface 30 may include a conversion unit 32 which converts a write access command and write data in an SDR format output from the CPU 202 into a DDR format and outputs the converted result to the memory module 300. The conversion unit 32 may convert read data in the DDR format output from the memory module 300 into the SDR format based on a read access command in the SDR format output from the CPU 202, and output the converted read data to the CPU 202. Even in a case where the memory module 300 having an interface different from the memory die MEM is coupled to the stacked memory 102, the memory module 300 may be accessed via the common channel CH by the conversion unit 32.

The conversion unit 32 converts the write data output from the CPU 202 to reduce by half of the number of bits, and a transmission rate is converted to 2 times and the converted write data is output to the memory module 300. In the same manner, the read data from the memory module 300 is converted to 2 times the number of bits, and a transmission rate is converted by half, and the converted read data is output to the CPU 202. For example, data transmitted between the CPU 202 and the memory module interface 30 is 128 bits, and data transmitted between the memory module interface 30 and the memory module 300 is 64 bits.

In the same manner as the shipping type illustrated in FIG. 2, the stacked memory 102 is shipped as a stacked memory (a high-speed memory mode product) in a case where all the memory dies MEM are normally operated, and is shipped as a combined product (a mixed memory mode product) in a case where some of the memory dies MEM do not operate normally. In a case where all the memory dies MEM do not operate normally, the stacked memory 102 is shipped as a memory module interface component (a memory module mode product).

Figure 5:
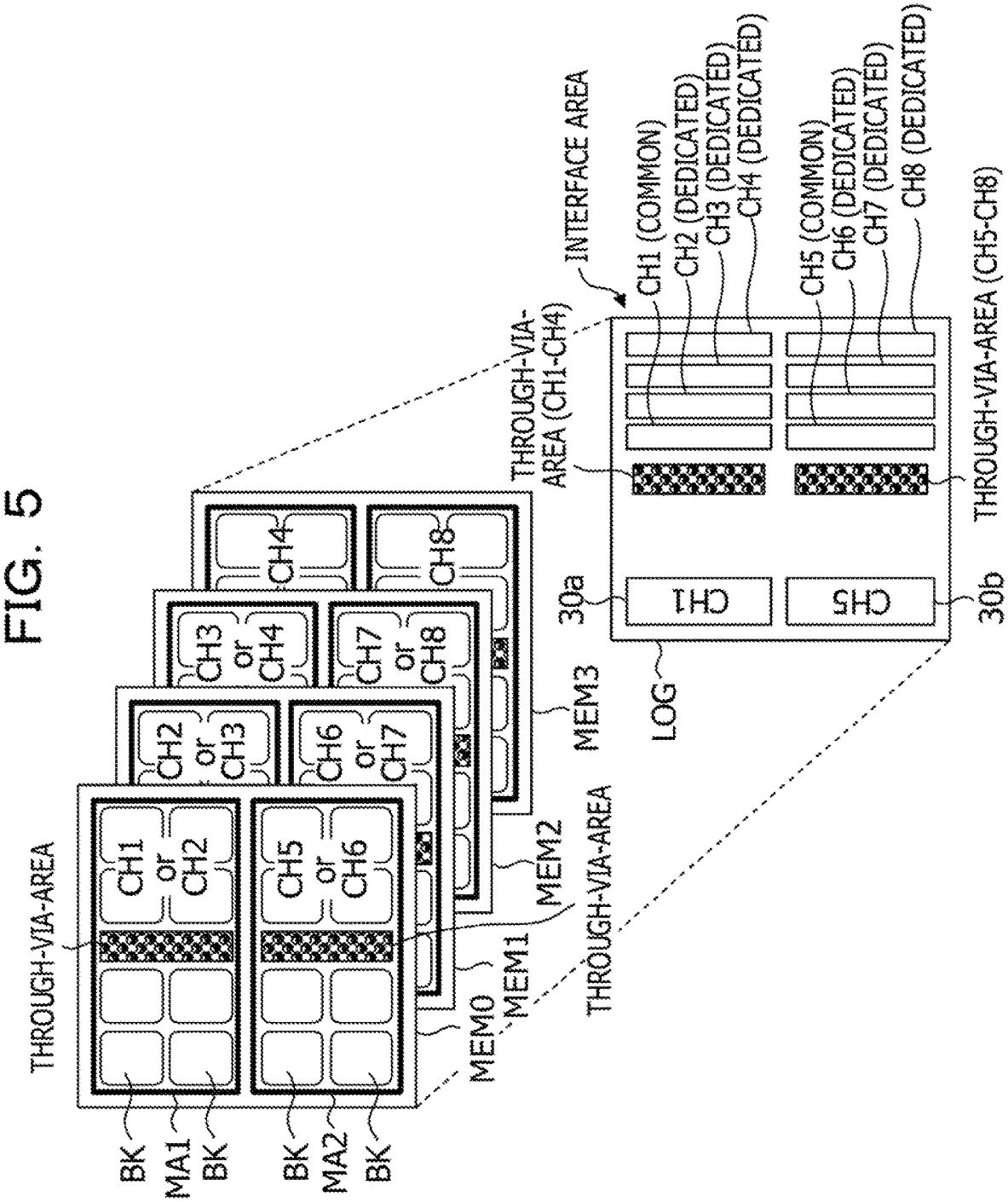
FIG. 5 is an explanatory diagram illustrating an example of an outline of a layout of the stacked memory in FIG. 4.

FIG. 5 illustrates an example of an outline of a layout of the stacked memory 102 in FIG. 4. Each of the memory dies MEM1 to MEM4 and the logic die LOG has a through-via-area which forms a TSV at a central portion of the die in a longitudinal direction in FIG. 5. Each of the memory dies MEM1 to MEM4 has, for example, the memory area MA1 on the upper side in FIG. 5 and the memory area MA2 on the lower side in FIG. 5. For example, each of the memory areas MA1 and MA2 corresponds to one channel CH and has 8 banks BK. The TSVs formed in the through-via-area are independent for the memory areas MA1 and MA2 of the memory die MEM.

In the logic die LOG, an interface area including the input and output interface unit PHY has interfaces of channels CH5, CH6, CH7, and CH8 on the upper side in FIG. 5 and interfaces of channels CH1, CH2, CH3, and CH4 on the lower side in FIG. 5. In FIG. 5, description of the switch unit 12 is not illustrated.

Figure 6:
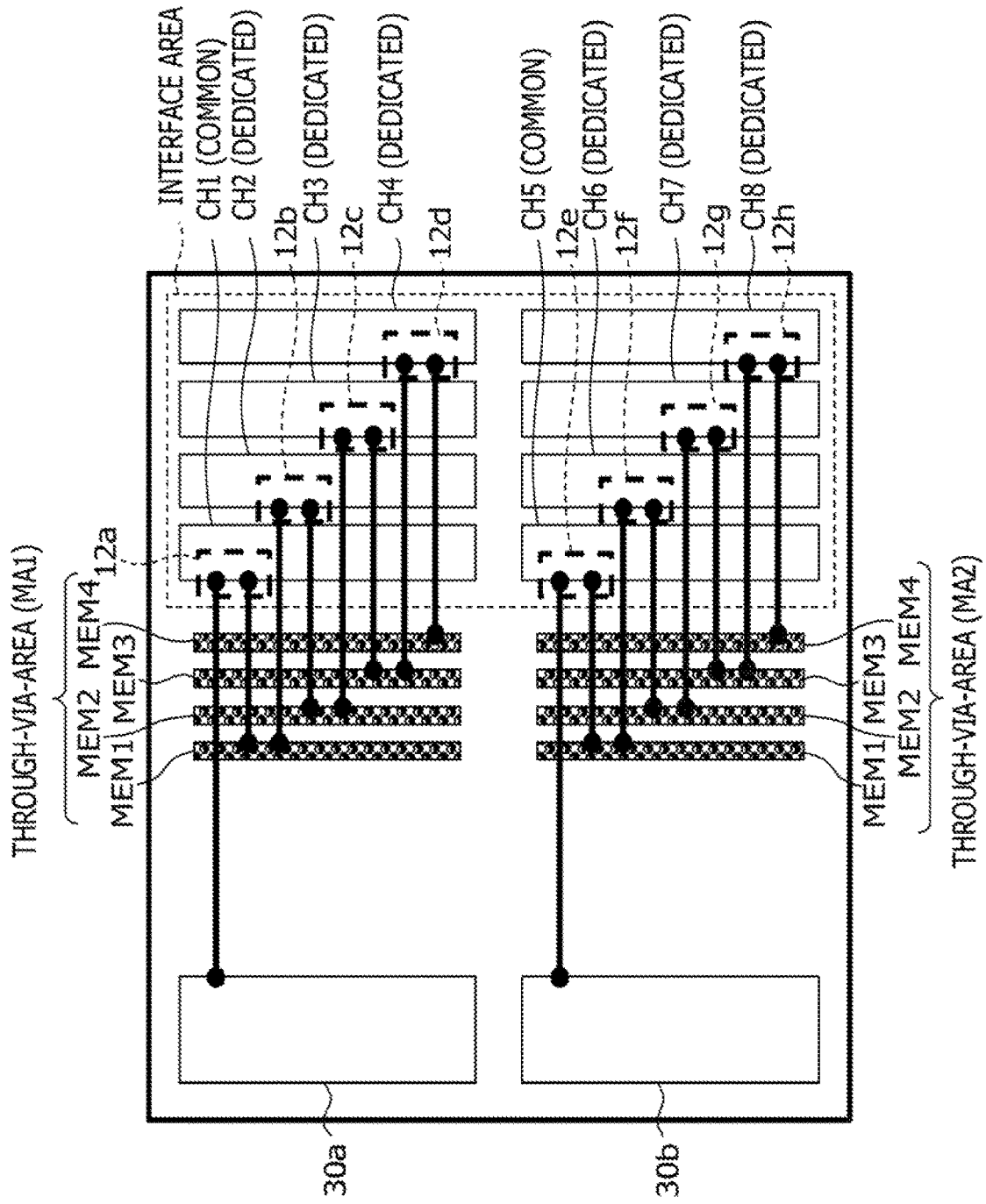
FIG. 6 is an explanatory diagram illustrating an example of an outline of a layout of a logic die in FIG. 5.

FIG. 6 illustrates an example of an outline of a layout of the logic die LOG illustrated in FIG. 5. The thick solid line extending in a horizontal direction in FIG. 6 indicates a signal line, and a thick broken line frame in an interface area indicates the switches 12a to 12h of the switch unit 12. The switch unit 12 may be provided in an area different from the interface area.

A through-via-area is provided independently for each of the memory areas MA1 and MA2 of each of the memory dies MEM1 to MEM4. Two wirings (actually, a large number of wirings) from the switch 12a are coupled to the memory module interface 30a and a through-via-area including a TSV coupled to the memory area MA1 of the memory die MEM1.

Two wirings from the switch 12a coupled to the channel CH1 are coupled to a through-via-area including a TSV coupled to the memory area MA1 of the memory die MEM1 and a through-via-area including a TSV coupled to the memory area MA1 of the memory die MEM2. Two wirings from the switch 12b coupled to the channel CH2 are coupled to a through-via-area including a TSV coupled to the memory area MA1 of the memory die MEM1 and a through-via-area including a TSV coupled to the memory area MA1 of the memory die MEM2.

Two wirings from the switch 12c coupled to the channel CH3 are coupled to a through-via-area including a TSV coupled to the memory area MA1 of the memory die MEM2 and a through-via-area including a TSV coupled to the memory area MA1 of the memory die MEM3. Two wirings from the switch 12d coupled to the channel CH4 are coupled to a through-via-area including a TSV coupled to the memory area MA1 of the memory die MEM3 and a through-via-area including a TSV coupled to the memory area MA1 of the memory die MEM4.

Two wirings from each of the switches 12e to 12h respectively coupled to the channels CH5 and CH6 are coupled in the same manner as the two wirings from each of the switches 12a to 12d except that the wirings are coupled to the memory area MA2.

According to the wiring layout illustrated in FIG. 6, each of the memory dies MEM1, MEM2, and MEM3 may be coupled to one of the two channels CH via the switch unit 12. Thus, even in a case where there is a coupling failure in the through-via-area coupled to one of the two channels CH, by coupling the memory die MEM to the other of the channels, it is possible to access the memory die MEM. For example, it is possible to relieve the coupling failure in the through-via-area.

Figure 7:
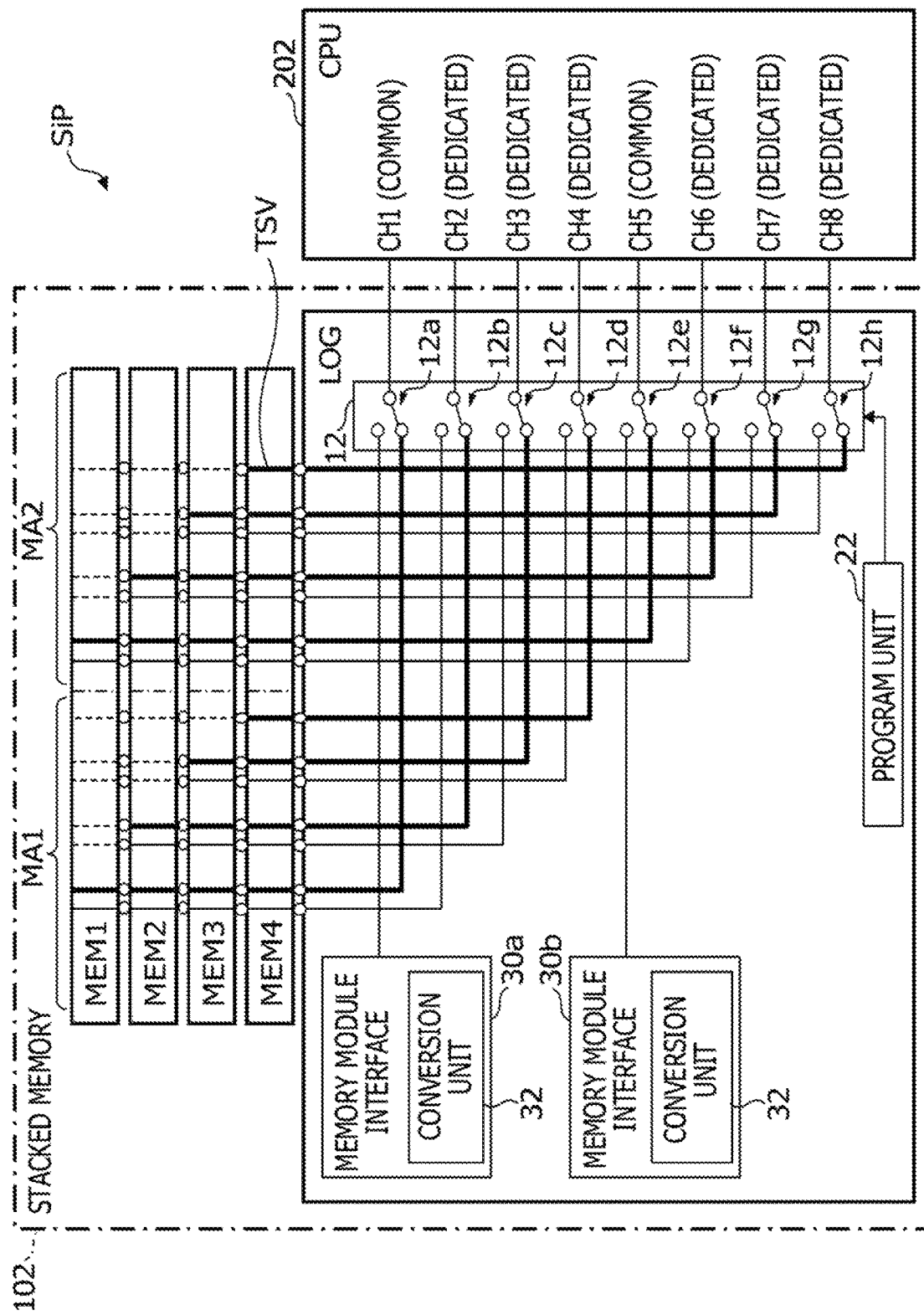
FIG. 7 is a block diagram illustrating another example of the system-in-package in FIG. 3.

FIG. 7 illustrates another example of the system-in-package SIP in FIG. 3. In the stacked memory 102 illustrated in FIG. 7, all of the memory dies MEM1 to MEM4 operate normally. In this case, the stacked memory 102 is shipped in a state in which the program unit 22 is programmed as the high-speed memory mode product illustrated in FIG. 2, and the switches 12a to 12h are switched to the states illustrated in FIG. 7. In FIG. 7, a signal line indicated by a thick solid line is a signal line coupled to one of the channels CH of the CPU 202, and indicates a valid signal line selected by the switch unit 12.

In the high-speed memory mode product in which all the memory dies MEM1 to MEM4 are normally operated, the memory module 300 (FIG. 4) is not coupled to the system-in-package SIP. In this case, the silicon interposer 40, the package substrate 50, and the motherboard 60 illustrated in FIG. 3 may not include wirings coupled to the memory module 300. The CPU 202 reads and writes data to and from the memory dies MEM1 to MEM4 of the stacked memory 102.

Figure 8:
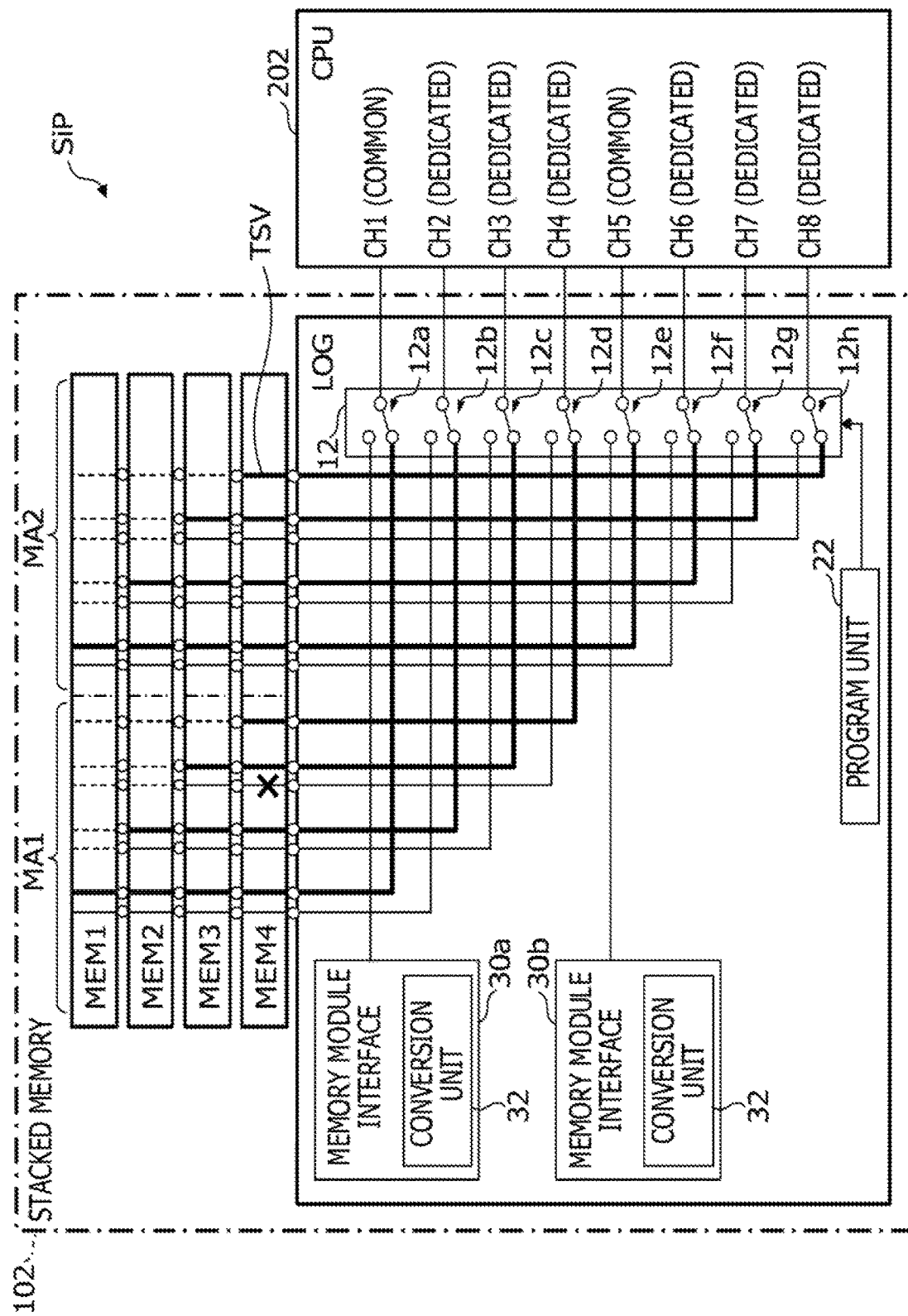
FIG. 8 is a block diagram illustrating still another example of the system-in-package in FIG. 3.

FIG. 8 illustrates still another example of the system-in-package SIP in FIG. 3. The X mark illustrated in FIG. 8 indicates that there is a coupling failure between one of the memory dies MEM and the logic die LOG, and does not indicate that there is a failure in a TSV of the memory die MEM4.

In the stacked memory 102 illustrated in FIG. 8, there is a coupling failure in a through-via-area corresponding to the channel CH4 between the memory area MA1 of the memory die MEM3 and the logic die LOG, and in a case where the channel CH4 is used, it is not possible to normally access the memory area MA1 of the memory die MEM3. Meanwhile, by coupling the memory area MA1 of the memory die MEM3 to the channel CH3 via the switch 12c, the CPU 202 may access the memory area MA1 of the memory die MEM3. Therefore, in the same manner as FIG. 7, the stacked memory 102 may be shipped as a high-speed memory mode product in which all of the memory dies MEM1 to MEM4 are normally operated. Therefore, also in FIG. 8, the memory module 300 (FIG. 4) is not coupled to the system-in-package SIP.

Figure 9:
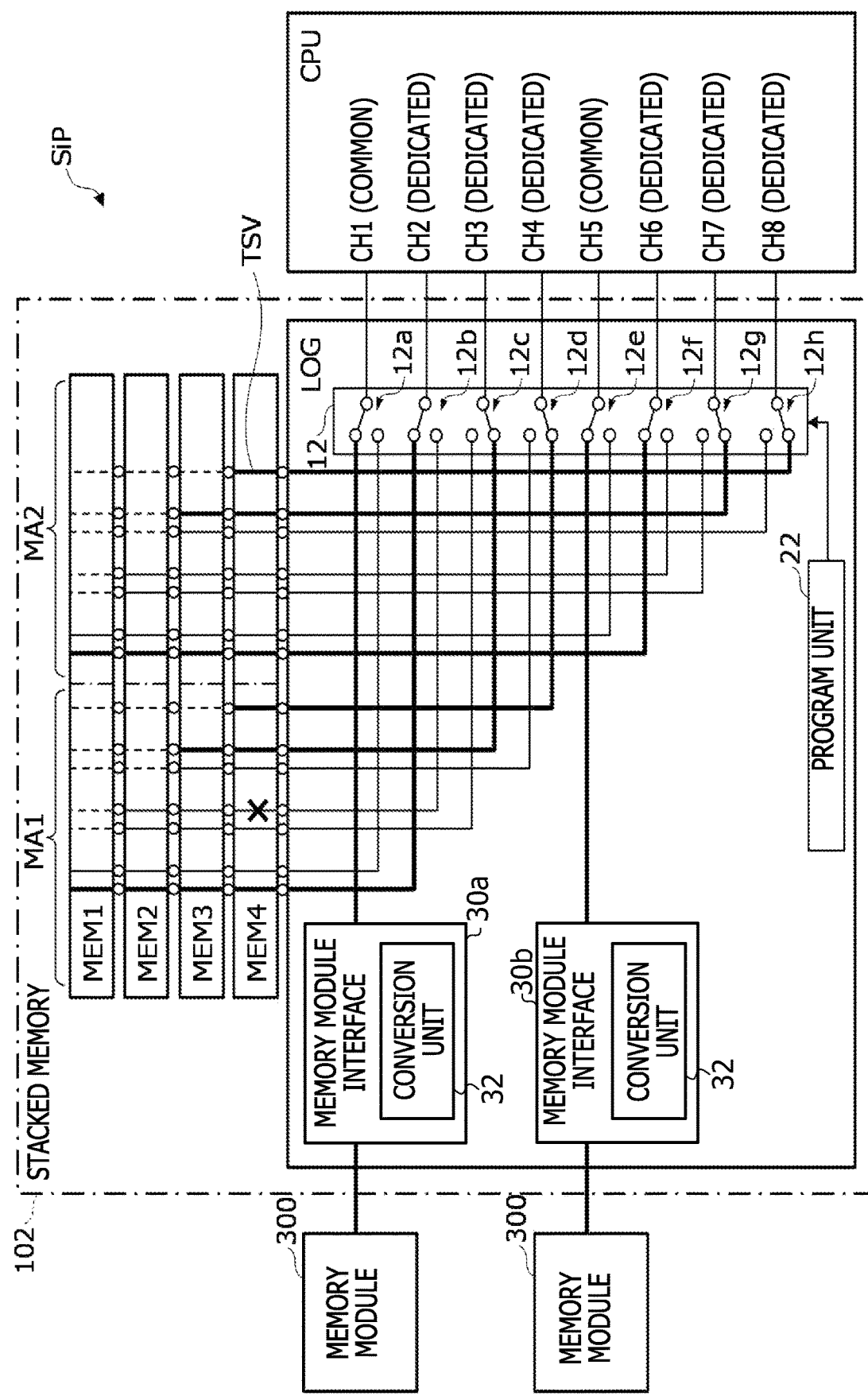
FIG. 9 is a block diagram illustrating still another example of the system-in-package in FIG. 3.

FIG. 9 illustrates still another example of the system-in-package SiP in FIG. 3. As illustrated by the X mark, the stacked memory 102 illustrated in FIG. 9 has a coupling failure in a through-via-area corresponding to the channel CH2 between the memory area MA1 of the memory die MEM2 and the logic die LOG. Therefore, in a case where the channel CH2 is used, it is not possible to normally access the memory area MA1 of the memory die MEM2. In a case where the memory area MA1 of the memory die MEM2 is coupled to the channel CH3, only one of the memory areas MA1 of the memory dies MEM3 and MEM4 may be coupled to the channel CH4. In this case, it is not possible to access all of the memory areas MA1 of the memory dies MEM1 to MEM4.

Therefore, the stacked memory 102 is shipped in a state in which the program unit 22 is programmed as the combined product (a mixed memory mode product) illustrated in FIG. 2, and the switches 12a to 12h are switched to the states illustrated in FIG. 9. In a case of the combined product, the memory module 300 is coupled to the system-in-package SiP. The CPU 202 may access both the memory die MEM1, the MEM3, and the MEM4 and the memory module 300.

For example, the states of the switches 12a to 12d corresponding to the memory area MA2 and the states of the switches 12e to 12h corresponding to the memory area MA2 are set to the same states. Meanwhile, the states of the switches 12e to 12h corresponding to the memory area MA having no failure in the through-via-area may be set to the same states as those of the switches 12e to 12h illustrated in FIG. 8. In this case, only one memory module 300 may be coupled, but the CPU 202 may access all the memory areas MA2 of the memory dies MEM1 to MEM4.

Figure 10:
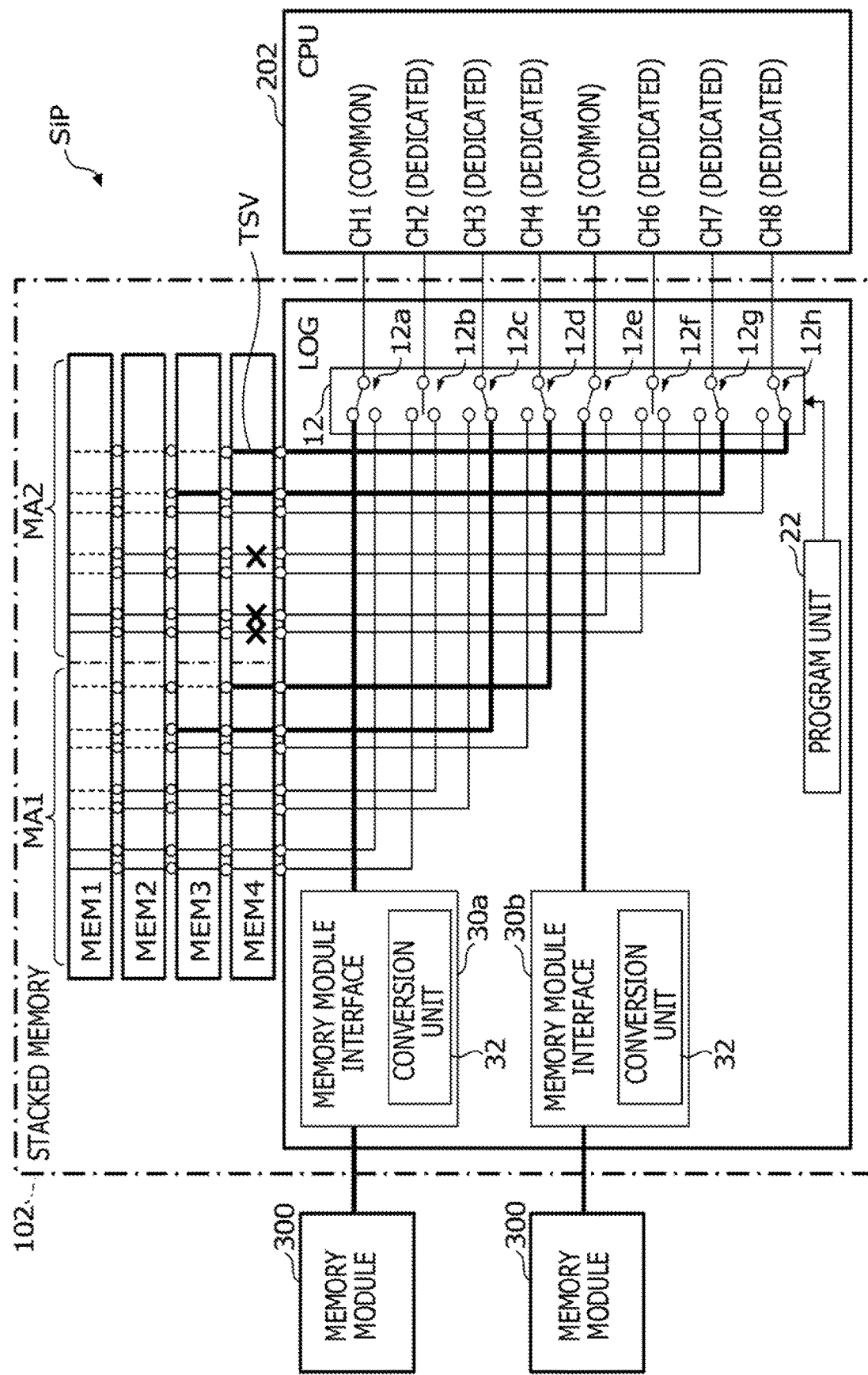
FIG. 10 is a block diagram illustrating still another example of the system-in-package in FIG. 3.

FIG. 10 illustrates still another example of the system-in-package SiP in FIG. 3. As illustrated by the X mark, the stacked memory 102 illustrated in FIG. 10 has coupling failures in through-via-areas corresponding to the channels CH5 and CH6 between the memory area MA2 of the memory die MEM1 and the logic die LOG. There is a coupling failure in a through-via-area corresponding to the channel CH6 between the memory area MA2 of the memory die MEM2 and the logic die LOG.

In this case, in the same manner as FIG. 9, the stacked memory 102 is shipped in a state in which the program unit 22 is programmed as the combined product (a mixed memory mode product) illustrated in FIG. 2, and the switches 12a to 12h are switched to the states illustrated in FIG. 10. The memory module 300 is coupled to the system-in-package SiP.

In FIG. 10, the switches 12b and 12f are set to an open state, but may be set to be coupled to one of the memory dies MEM1 and MEM2. The states of the switches 12a to 12d corresponding to the memory area MA1 having no failure in the through-via-area may be set to the same state as those of the switches 12a to 12d illustrated in FIG. 8. In this case, only one memory module 300 may be coupled, but the CPU 202 may access all the memory areas MA1 of the memory dies MEM1 to MEM4.

Figure 11:
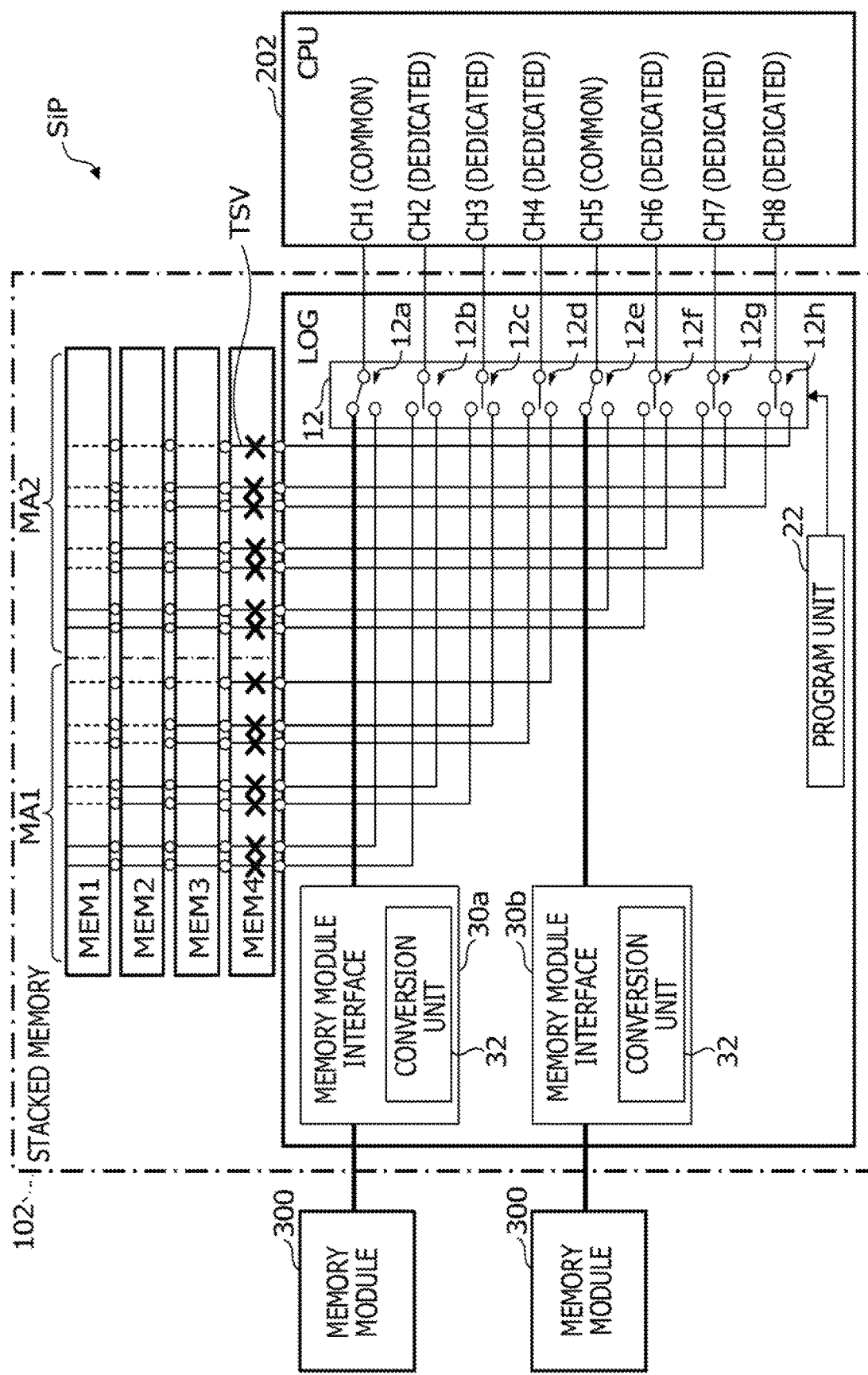
FIG. 11 is a block diagram illustrating still another example of the system-in-package.

FIG. 11 illustrates still another example of the system-in-package SiP in FIG. 3. As illustrated by the X mark, the stacked memory 102 illustrated in FIG. 11 has coupling failures in through-via-areas between all the memory areas MA1 and MA2 of all the memory dies MEM1 to MEM4 and the logic die LOG.

In this case, the stacked memory 102 is shipped in a state in which the program unit 22 is programmed as the memory module interface component (a memory module mode product) illustrated in FIG. 2, and the switches 12a to 12h are switched to the states illustrated in FIG. 11. The memory module 300 is coupled to the system-in-package SiP. In FIG. 11, the switches 12b, 12c, 12d, 12f, 12g, and 12h are set to an open state, but may be set to be coupled to one of the memory dies MEM1 and MEM2.

Figure 12:
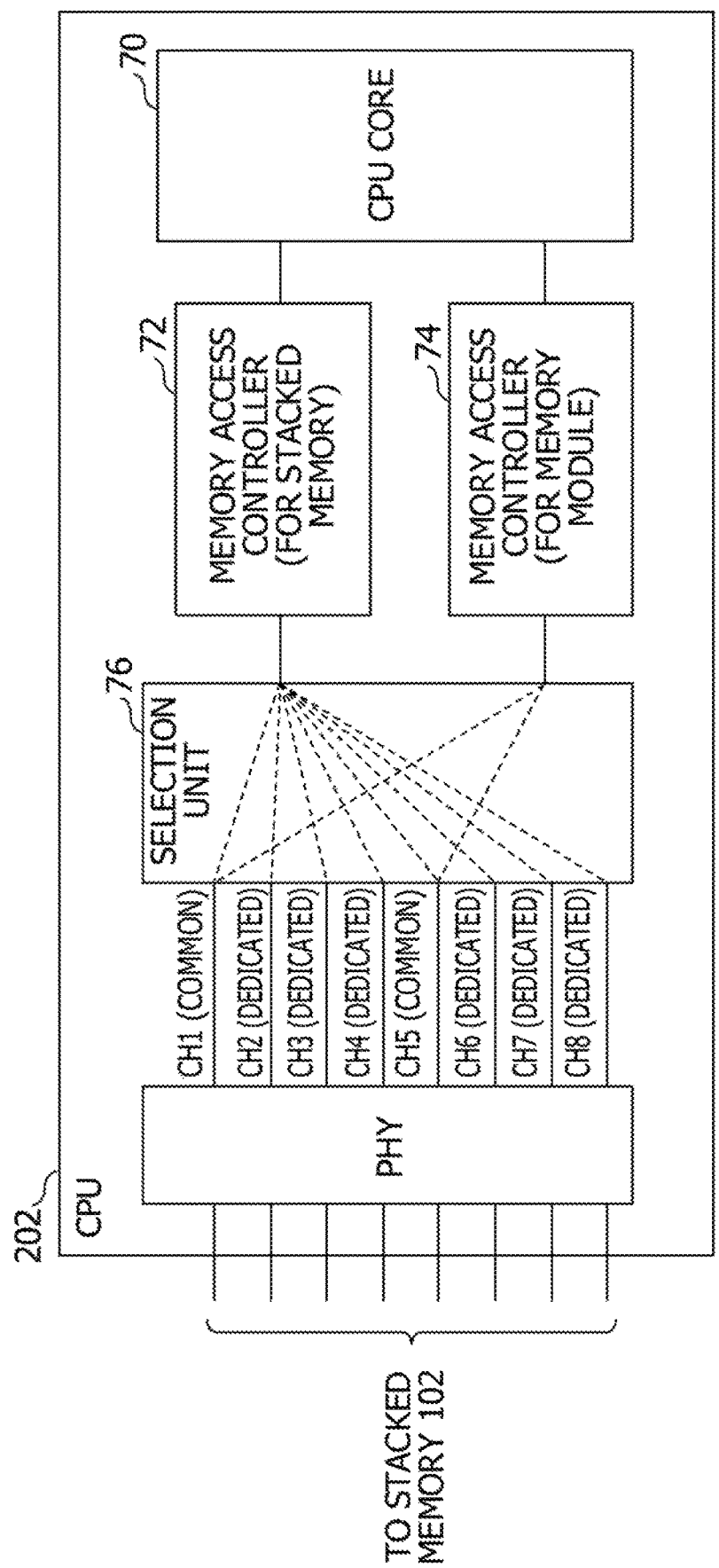
FIG. 12 is a block diagram illustrating an example of a central processing unit (CPU) in FIG. 3.

FIG. 12 illustrates an example of the CPU 202 illustrated in FIG. 3. The CPU 202 includes a CPU core 70 including a computing unit, a memory address generation unit, a register file, and the like, a memory access controller 72 for the stacked memory 102, and a memory access controller 74 for the memory module 300. The CPU 202 also includes a selection unit 76 and the input and output interface unit PHY. The memory access controller 72 is an example of a first memory access control unit, and the memory access controller 74 is an example of a second memory access control unit.

The memory access controller 72 is used in a case of accessing the stacked memory 102 of the high-speed memory mode product or mixed memory mode product illustrated in FIG. 2. For example, the memory access controller 72 outputs a memory access request to the selection unit 76 based on an instruction from the CPU core 70. The memory access controller 74 is used in a case of accessing the stacked memory 102 of the mixed memory mode product or the memory module mode product illustrated in FIG. 2. For example, the memory access controller 74 outputs a memory access request to the selection unit 76 based on an instruction from the CPU core 70. The memory access request output from the memory access controller 72 is an example of a first memory access request, and the memory access request output by the memory access controller 74 is an example of a second memory access request.

Based on an access address included in the memory access request, the selection unit 76 selects a signal line (a control signal line, an address signal line, a data signal line, or the like) of the channel CH assigned for each access address in advance, and outputs the memory access request to the selected signal line. The function of the selection unit 76 may be included in each of the memory access controllers 72 and 74. In this case, the memory access controller 72 outputs a memory access request to one of the channels CH1 to CH8, and the memory access controller 74 outputs a memory access request to the channel CH1 or the channel CH5.

In this embodiment, the CPU 202 includes two types of memory access controllers 72 and 74. Therefore, the CPU 202 may be coupled to the stacked memory 102 of any one of the high-speed memory mode product, the mixed memory mode product, and the memory module mode product illustrated in FIG. 2. As a result, it is possible to reduce a development cost of the CPU 202 as compared with a case where the CPU 202 is developed for each of the high-speed memory mode product, the mixed memory mode product, and the memory module mode product.

As described above, even in the embodiments illustrated in FIGS. 3 to 12, even in a case where any one or all of the memory dies MEM do not operate in the same manner as in the embodiment illustrated in FIG. 1 and FIG. 2, the stacked memory 102 may be used as the mixed memory mode or the memory module mode. Thus, it is possible to reduce a discard rate of the stacked memory 102 and to reduce a manufacturing cost of the stacked memory 102 as compared with a case where all the memory dies MEM do not operate and may not be shipped.

In the embodiments illustrated in FIGS. 3 to 12, since the memory die MEM may be coupled to one of the two channels CH via the switch unit 12, even in a case where there is a coupling failure in a part of the through-via-area, the coupling failure may be relieved. By providing TSVs respectively corresponding to the two channels CH in each of the memory dies MEM1 to MEM3, signal transmission paths may be independent to each other, and noise resistance may be improved as compared with a case where the signal paths are shared by the common TSVs.

By providing the conversion unit 32 in the memory module interface 30 of the logic die LOG, the memory module 300 of the interface different from the memory die MEM may be accessed via the common channel CH.

The CPU 202 includes the memory access controller 72 used for accessing the stacked memory 102 and the memory access controller 74 used for accessing the memory module 300. Thus, the CPU 202 may be coupled to the stacked memory 102 of any one of the high-speed memory mode product, the mixed memory mode product and the memory module mode product, so that it is possible to reduce a development cost of the CPU 202.

Figure 13:
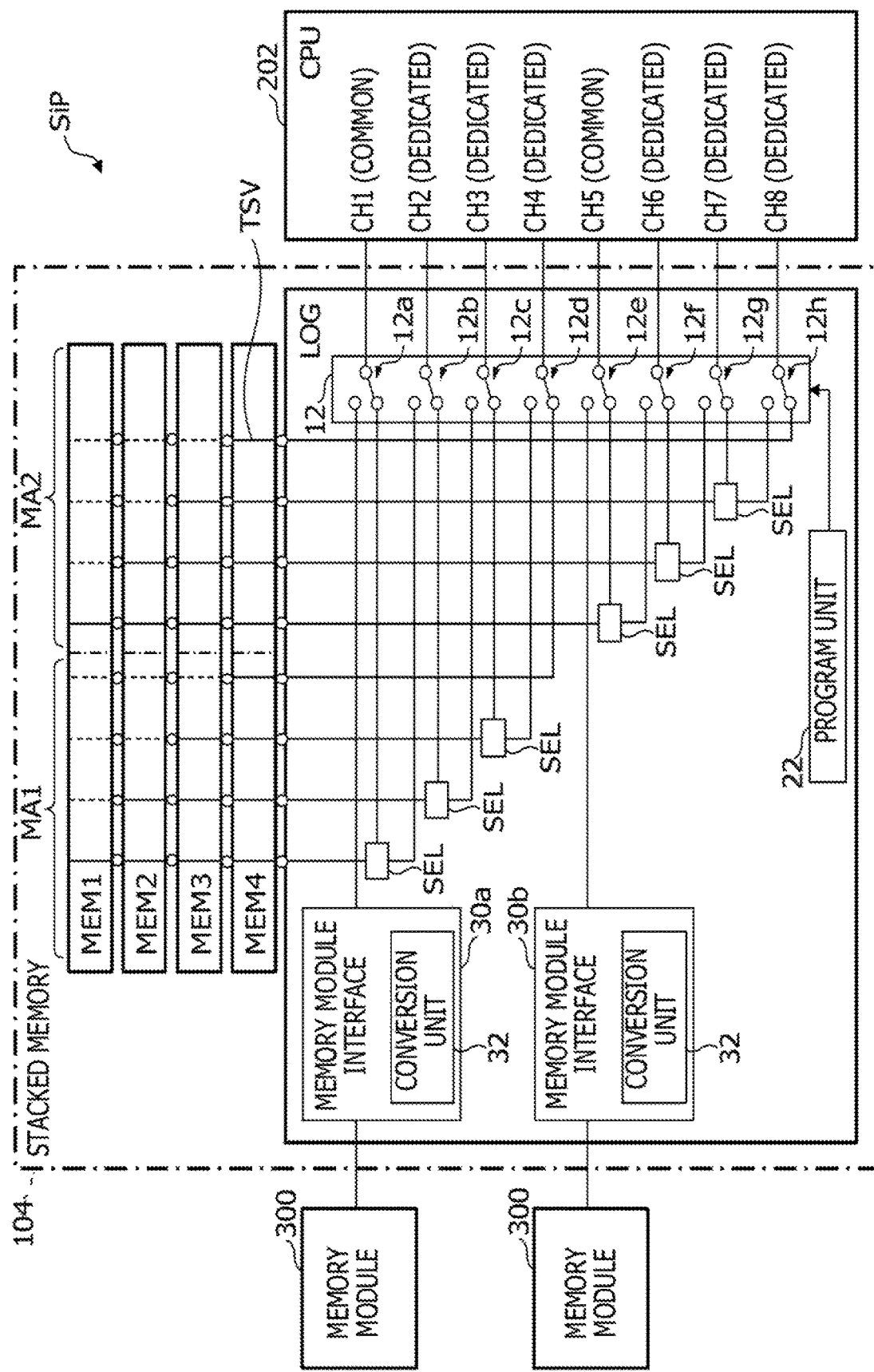
FIG. 13 is a block diagram illustrating an example of a system-in-package over which a semiconductor apparatus according to still another embodiment is mounted.

FIG. 13 illustrates an example of a system-in-package over which a semiconductor apparatus according to still another embodiment is mounted. Components which are the same as or which have the same manner as the components illustrated in FIGS. 1 and 4 are indicated by the same reference numerals, and detailed descriptions thereof will be omitted.

The system-in-package SiP illustrated in FIG. 13 is different from that illustrated in FIG. 4 in that a configuration of TSVs provided in the memory dies MEM1 to MEM4 and the logic die LOG is different from that in FIG. 4, and a selector SEL is provided in the logic die LOG. The other configuration of the system-in-package SiP is the same manner as that of the system-in-package SiP illustrated in FIG. 4.

In the logic die LOG, each selector SEL corresponds to each of the channels CH1 to CH8, and is provided between the switch unit 12 and the memory die MEM4. Each selector SEL selects a signal line of the channel CH selected by the switch unit 12, and couples the selected signal line to the memory die MEM4. Thus, the number of TSVs formed in each of the memory dies MEM and the logic die LOG may be reduced by half as compared with that in FIG. 4. By reducing the number of TSVs, it is possible to reduce an occurrence frequency of coupling failures in a manufacturing process of the stacked memory 102, and it is possible to improve a yield of the stacked memory 102. In a case where an influence of noise such as reflection may be ignored, a signal line selected by the selector SEL may be directly connected to the logic die LOG without providing the selector SEL (wired-OR coupling).

Figure 14:
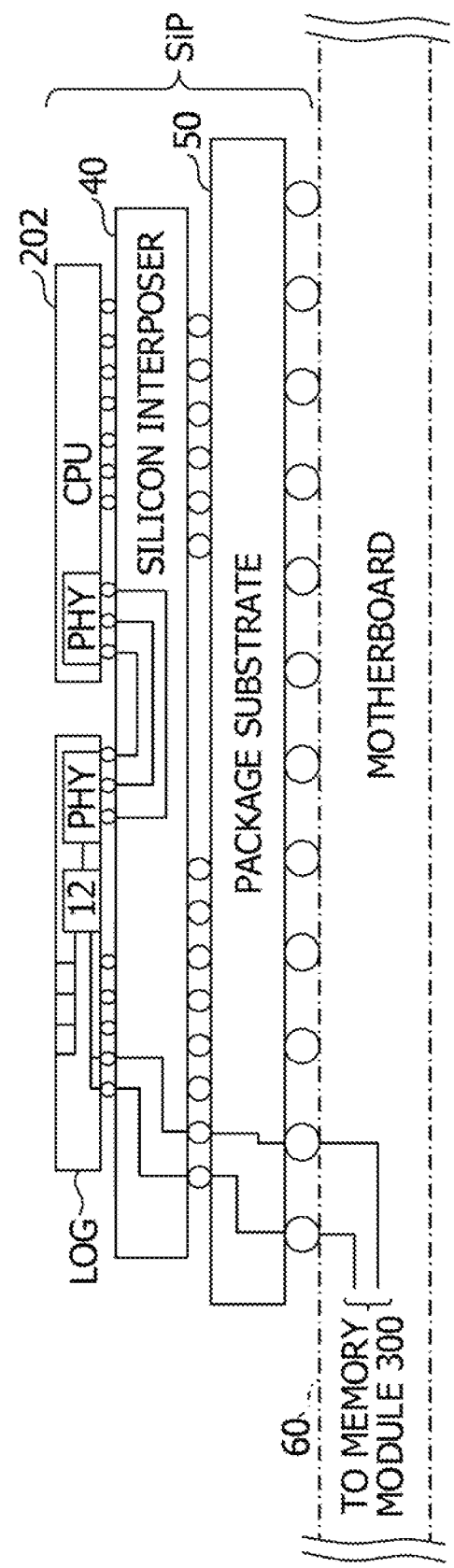
FIG. 14 is a side view illustrating the example of the system-in-package over which the semiconductor apparatus according to the other embodiment is mounted.

FIG. 14 illustrates an example of the system-in-package SIP over which a semiconductor apparatus according to still another embodiment is mounted. Components which are the same as or which have the same manner as the components illustrated in FIGS. 1, 3, and 4 are indicated by the same reference numerals, and detailed descriptions thereof will be omitted.

FIG. 14 illustrates a case where the system-in-package SiP is used as a dedicated die for the memory module interface 30 (a memory module mode product) illustrated in FIG. 1, and the memory die MEM is not coupled to the logic die LOG. In this manner, by using the logic die LOG and the CPU 202 to manufacture the system-in-package SiP which accesses the memory module 300, it is possible to reduce a development cost of the system-in-package SIP, and it is possible to reduce a development period.

As specifically described above, features and advantages of the embodiments are clarified. This is intended to cover the features and advantages of the embodiments as described above without departing from the spirit and scope of the claims. An ordinary skilled person in the art in the technical field may easily conceive any improvements or modifications. Therefore, there is no intention to limit the scope of the embodiment having the inventive aspect to those described above and it is also possible to rely on appropriate improvements and equivalents included in the range disclosed in the embodiments.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor memory apparatus comprising:
   a plurality of memory dies arranged in a stack configuration; and
   a logic die included in the stack configuration, the logic die includes
      a memory interface to couple a memory apparatus, and
      a switch coupled to a plurality of channels included in a control device,
   the switch includes
      a first switch element which couples a first channel of the plurality of channels to the memory interface or the first channel to a first memory die of the plurality of memory dies, and
      a second switch element which couples a second channel of the plurality of channels to a second memory die of the plurality of memory dies.

2. The semiconductor memory apparatus according to claim 1,
   wherein each of the plurality of memory dies is coupled to the logic die via a through-electrode provided in each of the plurality of memory dies, and
   at least one of the plurality of memory dies is coupled to both of the switch elements via respective through-electrodes different from each other.

3. The semiconductor memory apparatus according to claim 1,
   wherein each of the plurality of memory dies is coupled to the logic die via a through-electrode provided in each of the plurality of memory dies, and
   at least one of the plurality of memory dies is coupled to both of the switch elements via a common through-electrode.

4. The semiconductor memory apparatus according to claim 1,
   wherein
   the memory interface includes a convertor that converts a memory access request to the memory apparatus output from the control device into a double data rate (DDR) interface.

5. The semiconductor memory apparatus according to claim 1, further comprising:
   a program circuit in which switch states of the first switch element and the second switch element are programmed based on the results of an error test of the plurality of memory dies.

6. A data processing system comprising:
   a memory apparatus;
   a control device including a plurality of channels of communication;
   a plurality of memory dies arranged in a stack configuration; and
   a logic die included in the stack configuration, the logic die includes
      a memory interface to couple the memory apparatus to the logic die, and
      a switch coupled to the plurality of channels included in the control device, the switch includes
         a first switch element which couples a first channel of the plurality of channels to the memory interface or the first channel to a first memory die of the plurality of memory dies, and
         a second switch element which couples a second channel of the plurality of channels to a second memory die of the plurality of memory dies.

7. The data processing system according to claim 6,
   wherein the control device includes:
   a first memory access controller controlling an access to the plurality of memory dies;
   a second memory access controller controlling an access to the memory apparatus through the memory interface; and
   a selection circuit for outputting a memory access request from the first memory access controller to one of the plurality of channels and outputting a memory access request from the second memory access controller to another one of the plurality of channels.

8. The semiconductor memory apparatus according to claim 6,
   wherein each of the plurality of memory dies is coupled to the logic die via a through-electrode provided in each of the plurality of memory dies, and at least one of the plurality of memory dies is coupled to both of the switch elements via respective through-electrodes different from each other.

9. The semiconductor memory apparatus according to claim 6, wherein each of the plurality of memory dies is coupled to the logic die via a through-electrode provided in each of the plurality of memory dies, and at least one of the plurality of memory dies is coupled to both of the switch elements via a common through-electrode.

* * * * *